US011049386B2

(12) United States Patent
Zhang et al.

(10) Patent No.: US 11,049,386 B2
(45) Date of Patent: Jun. 29, 2021

(54) SWITCH WITH CURRENT AND VOLTAGE COLLECTION

(71) Applicant: Eaton Intelligent Power Limited, Dublin (IE)

(72) Inventors: Haidong Zhang, Shanghai (CN); Lin Yang, Jiangsu (CN); Lili Du, Shanghai (CN); Tao Xiong, Shanghai (CN); Shifang Zhang, Shanghai (CN)

(73) Assignee: Eaton Intelligent Power Limited, Dublin (IE)

( * ) Notice: Subject to any disclaimer, the term of this patent is extended or adjusted under 35 U.S.C. 154(b) by 588 days.

(21) Appl. No.: 16/008,133

(22) Filed: Jun. 14, 2018

(65) Prior Publication Data

US 2019/0385441 A1 Dec. 19, 2019

(51) Int. Cl.
*G08C 17/02* (2006.01)
*H02M 1/08* (2006.01)
*H03K 17/60* (2006.01)
*H02M 7/04* (2006.01)

(52) U.S. Cl.
CPC ............ *G08C 17/02* (2013.01); *H02M 1/08* (2013.01); *H03K 17/60* (2013.01); *H02M 7/04* (2013.01)

(58) Field of Classification Search
CPC .......... G08C 17/02; H02M 1/08; H02M 7/04; H03K 17/60
USPC ........................................................ 307/112
See application file for complete search history.

(56) References Cited

U.S. PATENT DOCUMENTS

| 5,424,709 A | 6/1995 | Tal |
| 5,563,509 A * | 10/1996 | Small .................. G01R 1/04 324/756.07 |
| 6,087,895 A * | 7/2000 | Ono ............... H03K 19/00346 327/565 |
| 6,593,538 B2 | 7/2003 | Perret et al. |
| 7,190,936 B1 | 3/2007 | Teo et al. |
| 7,288,951 B1 * | 10/2007 | Bailey ................ G01R 31/2856 324/750.05 |
| 9,026,648 B1 | 5/2015 | Slavin |
| 9,400,314 B2 * | 7/2016 | Humphrey ............. G01R 31/40 |
| 9,413,171 B2 | 8/2016 | Neyhart |
| 9,847,912 B1 | 12/2017 | Hutz et al. |
| 9,860,965 B2 | 1/2018 | Recker et al. |
| 9,881,493 B2 | 1/2018 | Kim et al. |
| 10,141,739 B1 | 11/2018 | Davis et al. |
| 10,164,541 B2 | 12/2018 | Onodera et al. |
| 10,564,226 B2 | 2/2020 | Katrak et al. |

(Continued)

OTHER PUBLICATIONS

Automated 3-way Switches: What should my wiring look like? (US version)—wiki—SmartThings Community, downloaded from internet Feb. 24, 2018, https://community.smartthings.com/t/automated-3-way-switches-what-should-my-wiring-look-like-us-version/19075.

*Primary Examiner* — Alfonso Perez Borroto
(74) *Attorney, Agent, or Firm* — Fox Rothschild LLP (57) ABSTRACT

A system for controlling delivery of power to a load includes a master control unit (MCU) and a synchronous solid-state relay. The MCU causes the relay to close when the voltage delivered to the relay is at a zero crossing state. The MCU causes the relay to open at either (a) the moment when the voltage delivered to the relay is at a zero crossing state, or (b) the moment that the current delivered to the relay is both over a threshold level and at a zero crossing state.

20 Claims, 8 Drawing Sheets

(56) References Cited

U.S. PATENT DOCUMENTS

| | | |
|---|---|---|
| 2001/0013790 A1* | 8/2001 | Kusumoto ......... G01R 31/2853 324/762.01 |
| 2002/0186037 A1* | 12/2002 | Eldridge .......... G01R 31/31924 324/754.07 |
| 2004/0051551 A1* | 3/2004 | Sunter ................ G01R 31/2841 324/762.02 |
| 2005/0275983 A1 | 12/2005 | Franklin et al. |
| 2013/0038318 A1 | 2/2013 | Inukai |
| 2014/0009270 A1 | 1/2014 | Yamazaki |
| 2014/0175875 A1 | 6/2014 | Newman, Jr. et al. |
| 2015/0143150 A1 | 5/2015 | Verdun |
| 2016/0107589 A1 | 4/2016 | Proebstle et al. |
| 2016/0322831 A1 | 11/2016 | Gilbert et al. |
| 2017/0019098 A1 | 1/2017 | Kang et al. |
| 2017/0027079 A1 | 1/2017 | Dombrowski et al. |
| 2017/0045249 A1 | 2/2017 | Lee et al. |
| 2017/0068267 A1 | 3/2017 | El-Gayyar |
| 2017/0069449 A1 | 3/2017 | El-Gayyar |
| 2017/0271904 A1 | 9/2017 | Ziv |
| 2018/0052008 A1 | 2/2018 | Maman et al. |
| 2018/0056902 A1 | 3/2018 | Trinkner et al. |
| 2018/0062534 A1 | 3/2018 | Xiong et al. |
| 2018/0083610 A1 | 3/2018 | Ishii et al. |
| 2018/0103211 A1 | 4/2018 | Marino et al. |
| 2018/0116039 A1 | 4/2018 | Harte et al. |
| 2019/0281642 A1 | 9/2019 | Su et al. |
| 2019/0289243 A1 | 9/2019 | Pretlow et al. |

* cited by examiner

SWITCH WITH CURRENT AND VOLTAGE COLLECTION

BACKGROUND

With the increasing ubiquity of "smart home" devices and the Internet of Things (IoT), the desire to control devices via wireless switches is rapidly expanding. Such switches may include, for example, wall switches that control a light, an outlet, or a ceiling fan. Such switches also may include switches that are otherwise connected to particular appliance or electronic device.

Many wireless switches can be activated by direct infrared (IR) or radio frequency (RF) controllers, or by devices that use short-range or near-field communication protocols such as Bluetooth or Bluetooth Low Energy (BLE). However, such devices and protocols require the remote controller to be very close to the switch, often with an unobstructed line-of-sight.

To address this issue, some manufacturers have begun to offer switches that are communicatively connected to one or more controllers and/or other electronic devices and a solid-state relay. When a synchronous solid-state relay is used, the relay changes from a non-conducting state to a conducting state when the AC input voltage crosses the zero-crossing point of its sine wave. This minimizes surge current to the load during the first conduction cycle. For this reason, a synchronous solid-state relay is sometimes referred to as a "zero crossing relay."

A problem with the use of synchronous solid-state relays in wireless switches can occur when there is passing zero phase inconsistency between the voltage and the current. For example, if the load is an inductive motor, the load current may be out of sync with (and typically behind) the load voltage. When this happens, if the switch is opened at a point that is not the current zero-crossing point, an arc can occur, causing electromagnetic current (EMC) interference and other damage. These issues can reduce the life of the relay, and can cause other issues.

This document describes devices and systems that are intended to address the problems described above, and/or other problems.

SUMMARY

In certain embodiments, a system for controlling delivery of power to a load includes a synchronous solid-state relay that delivers power to a load when closed and stops delivery of power to the load when open. The system may include a voltage collection unit that detects a voltage zero crossing state of voltage provided to the relay. The system may include a current collection unit that is configured to detect a current zero crossing state of current provided to the system. The system also includes a master control unit (MCU) having a processor, one or more input terminals that are electrically collected to the voltage collection unit, and one or more output terminals that are electrically connected to the relay.

The MCU implements programming instructions that cause it to command the relay to open and close in response to received commands and other detected signals. Upon receipt of a command to close the relay, the MCU will analyze a signal from the voltage collection unit, and it will close the relay when the signal from the voltage collection unit indicates that the relay is at the voltage zero crossing state. Upon receipt of a command to open the relay, the system will analyze a current level signal from the current collection unit if available. If the current level signal is above a threshold level, the MCU will cause the relay to open when current provided to the system is at the current zero crossing state. If the current level signal is not above the threshold level, the MCU will cause the relay to open when the voltage provided to the relay is at the voltage zero crossing state.

The system also may include an AC-to-DC power converter that is electrically connected to the MCU. The AC-to-DC power converter will convert power received from an AC source into DC power, and it will provide the DC power to the MCU and to the relay. The AC-to-DC power converter may include a half-wave bridge that receives AC power from the AC source and converts the AC power into DC power of a first voltage. The AC-to-DC power converter also may include one or more DC-to-DC converters that step down the DC power from a higher first voltage to a relatively lower second voltage that corresponds to a voltage requirement of the load. The AC-to-DC power converter also may include a resistor-capacitor voltage drop circuit that includes a zener diode, the DC-to-DC converter, and a voltage drop capacitor that are electrically connected to each other in parallel.

The voltage collection unit may detect the zero crossing state of voltage provided to the relay by being electrically connected to a DC output of an AC-to-DC power converter that is electrically connected to the relay, and thus being configured to detect the zero crossing state of voltage at the DC output. The voltage collection unit also may include a transistor, of which the base is electrically connected to a neutral line of the AC-to-DC power converter, and of which the emitter is electrically connected to ground.

The current collection unit may include a set of comparators that provide a signal of a first state when the current collection unit senses a current zero crossing. The comparators provide a signal of a second state when the current collection unit does not sense a current zero crossing. The current collection unit may detect the zero crossing state of current provided to the relay by being electrically connected to an input line of an AC-to-DC power converter that is electrically connected to the relay, and thus being configured to detect the zero crossing state of current across the input line.

The system also may include a button unit that includes a switch and that is configured to change a state of a signal to the MCU when the switch is actuated.

In various other embodiments, a method of controlling delivery of power to a load includes, by a master control unit (MCU) of a system comprising the MCU and a voltage collection unit (VCU): (i) receiving a command to open a synchronous solid-state relay; (ii) analyzing a signal from the VCU to determine whether the signal from the VCU indicates that the relay is at a voltage zero crossing state; and (iii) opening the relay if the signal from the VCU indicates that the relay is at a voltage zero crossing state, otherwise not opening the relay until the signal from the VCU indicates that the relay is at a voltage zero crossing state.

If the system also includes a current collection unit (CCU), the MCU may receive a command to open the relay, and the MCU will then analyze a current level signal from the CCU. If the current level signal is above a threshold, the MCU may close the relay when the CCU indicates that the system is at a current zero crossing state. If the current level is not above the threshold, the MCU may close the relay when the signal from the VCU indicates that the relay is at the voltage zero crossing state.

DETAILED DESCRIPTION

Terminology that is relevant to this disclosure includes:

As used in this document, the singular forms "a," "an," and "the" include plural references unless the context clearly dictates otherwise. Unless defined otherwise, all technical and scientific terms used herein have the same meanings as commonly understood by one of ordinary skill in the art. When used in this document, the term "comprising" (or "comprises") means "including (or includes), but not limited to." When used in this document, the term "exemplary" is intended to mean "by way of example" and is not intended to indicate that a particular exemplary item is preferred or required.

In this document, when terms such "first" and "second" are used to modify a noun, such use is simply intended to distinguish one item from another, and is not intended to require a sequential order unless specifically stated. The term "approximately," when used in connection with a numeric value, is intended to include values that are close to, but not exactly, the number. For example, in some embodiments, the term "approximately" may include values that are within +/−10 percent of the value.

In this document, the terms "processor" and "processing device" refer to a hardware component of an electronic device that is configured to execute programming instructions. Except where specifically stated otherwise, the singular terms "processor" and "processing device" are intended to include both single-processing device embodiments and embodiments in which multiple processing devices together or collectively perform a process.

In this document, the term "electronic communication" refers to the transmission of data via one or more signals between two or more electronic devices, whether through a wired or wireless network, and whether directly or indirectly via one or more intermediary devices. Devices are "communicatively connected" if the devices are able to send and/or receive data via a communication link.

In some embodiments, the devices and systems described in this document are designed to communicate with each other and/or be remotely controlled by a wireless communications network. The network will typically have a central network controller, such as a wireless router, that broadcasts a network ID. The central network controller will manage communications between devices on the network, either by itself or with the assistance of one or more secondary network controllers. Secondary controllers may be used in a mesh network or other network topology. Secondary controllers, as well as other devices that are communicatively connected to the network, are sometimes referred to as "nodes." Each controller may include or be communicatively connected to a processor and a memory device containing programming instructions that are configured to cause the processor to perform the described functions. Examples of communication protocols that may be used in a wireless communication system include wireless TCP/IP (commonly known as WiFi), ZigBee and Z-wave. The Z-wave communication protocol operates at a specified frequency (such as 908.42 MHz in the United States or 868.42 MHz in Europe, and it uses mesh network topology. A Z-wave network may or may not use secondary controllers, and communications may be transmitted across the network through any interconnected stationary device (each, a node), so that signals can move around communication obstacles and move beyond the range of any single stationary device on the network.

Notwithstanding the previous paragraphs, the invention and embodiments described and claimed in this document are not limited to those with wireless capabilities. Switches that are controlled with a tactile actuator such as a button, without wireless capability, are also within the scope of this disclosure.

Figure 1:
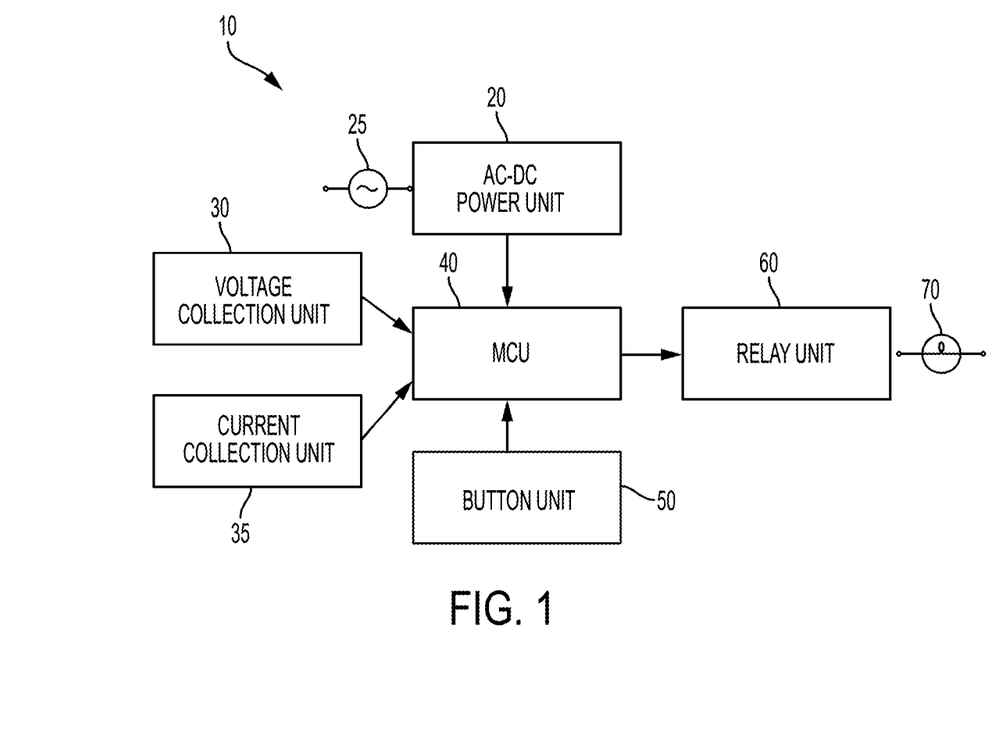
FIG. 1 is a block diagram illustrating an overall circuit structure.

FIG. 1 is a block diagram illustrating example elements of a circuit 10 that may be components of a switch to control an electrically connected load 70, such as a light, fan, or motor. The elements include an AC-to-DC power converter unit 20, which serves the function of converting alternating current (AC) power received from an AC source 25 to direct current (DC) power. The elements also may include a button unit 50 that includes a tactile switch, such as a physical switch or a touch-sensitive display, that may be physically operated to selectively connect and disconnect the circuit path between the AC-DC power converter unit 20 and the load 70. The elements also include a master control unit (MCU) 40, which includes elements that, when actuated, will control a relay unit 60 and selectively deliver power to the load 70. The MCU 40 includes a processor, and it optionally may include or be connected to a wireless control unit an antenna that is configured to connect to a network and receive signals from a remote controller that is also communicatively connected to the network. The wireless controller will communicate with the remote controller using a wireless communication protocol such as WiFi, ZigBee or Z-wave.

The circuit 10 also includes a voltage collection unit 30 and a current collection unit 35, which serve the function of obtaining the voltage zero crossing signal and current zero crossing signal, respectively.

Figure 2:
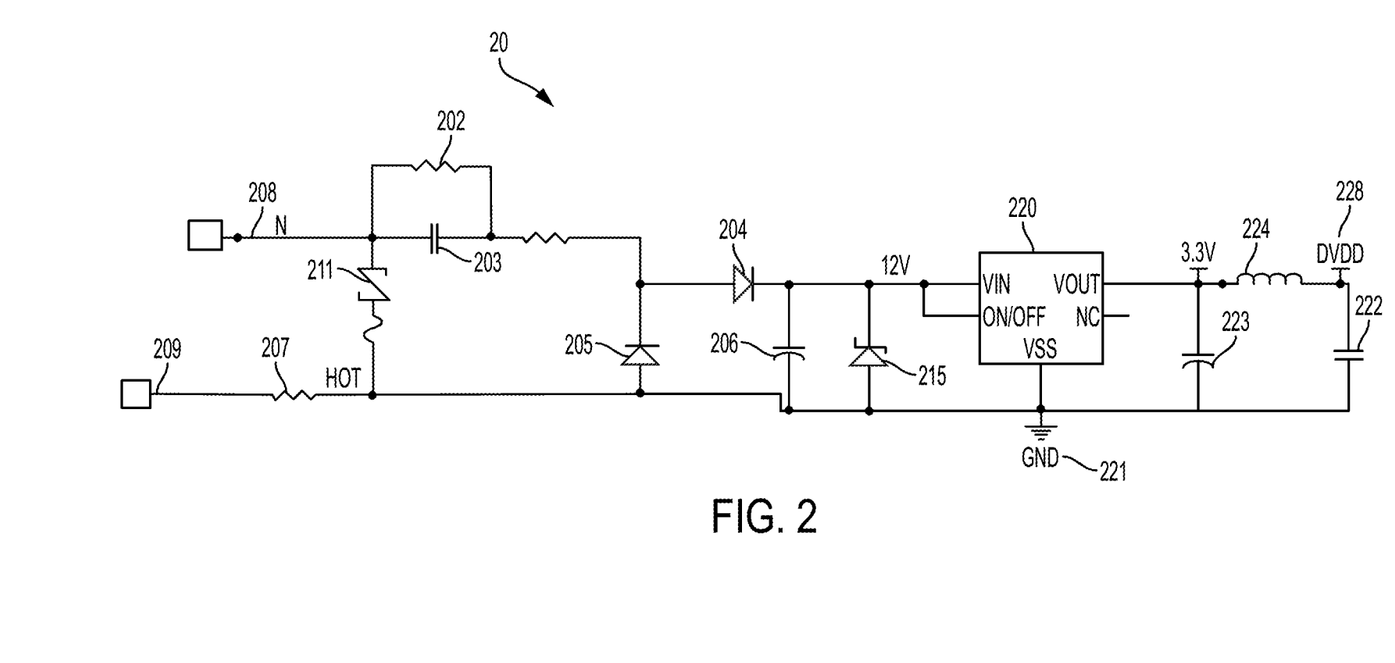
FIG. 2 is a circuit diagram of an example AC-DC power converter.

FIG. 2 is a circuit diagram of an example AC-to-DC power converter unit 20. AC power is received via a hot line 209 connects across a resistor 207 and a neutral line 208. The current collection unit (35 in FIG. 1) may be electrically connected across resistor 207 to collect current from the circuit. In the example shown, the AC-to-DC power converter circuit 20 includes a thermally protected metal oxide varistor (MOV) 211 positioned in parallel between the hot and neutral source terminals (209 and 208 respectively) to provide transient voltage suppression and help prevent circuit damage from transient overvoltage conditions.

The AC-DC power converter unit 20 includes a voltage drop circuit that includes a resistor 202 and a capacitor 202 connected in parallel. The AC-DC power converter unit 20 also includes an AC-to-DC converter circuit, shown by way of example as a half-wave bridge that includes diode 204 and diode 205. A positive voltage is applied to the half-wave bridge, which will convert AC power (such as approximately 120V AC or approximately 220V AC) into DC power (such as approximately 12V DC in some embodiments). Other voltages may be used depending on the requirements of the relay and other components of the system.

A capacitor 214 and zener diode 215 are connected in parallel across the output terminals of the half-wave bridge 213 to help regulate the rectifier's output voltage before it reaches a DC-to-DC converter 220. The DC-to-DC converter 220 is electrically connected between the positive output terminal of the half-wave bridge 213 and ground 221 to step down the DC voltage to a voltage that is appropriate for the load. For example, the zener diode 215 may have a breakdown voltage of about 12V, in which case the DC-to-DC converter 220 may step down the DC voltage from an input of about 12V to an output of about 3.3V which would be appropriate for a circuit that may control a light, fan or similar device. Other voltages may be employed in various embodiments depending on the nature of the load.

The DC-to-DC converter 220 forms part of a resistor-capacitor voltage drop circuit that includes zener diode 215, the DC-to-DC converter 220 and a non-polarized voltage drop capacitor 222, each electrically connected in parallel. The circuit also may include a polarized capacitor 223 and inductor 224 which provide the functions of a low-pass filter. The DC output of the AC-to-DC power unit 20 will be electrically connected to the MCU (40 in FIG. 1), which will be described in more detail below. In some embodiments, an additional DC-to-DC converter may be electrically between the DC output of the AC-to-DC power unit 20 and the MCU 40 to further step down the voltage, such as for example from 3.3V DC to 1.24 V DC.

Figure 3:
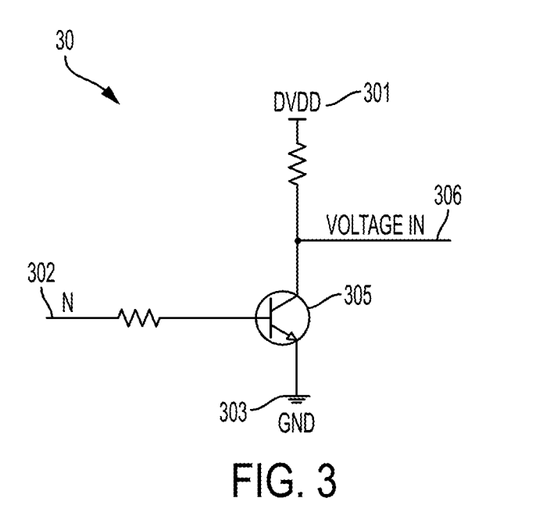
FIG. 3 is a circuit diagram of an example voltage collection unit.

FIG. 3 is a circuit diagram of an example voltage collection unit 30. The voltage collection unit 30 includes a DC (DVDD) power line 301) and a neutral line 302, and a ground connection 303. The neutral and ground lines may be respectively connected to the AC-to-DC power converter unit's neutral line and ground (208 and 221 respectively in FIG. 2), so that current flows from the neutral line 302 to the ground connection 303. Voltage is provided across a bipolar junction transistor 305 via the DVDD terminal 301 and ground 303, which are electrically connected to their corresponding elements (228 and 221 in FIG. 2) of the AC-to-DC power converter unit.

The transistor 305 senses voltage across it and can be used to identify when a voltage zero crossing occurs in the system. The base of the transistor 305 is electrically connected to a neutral line of the input signal 302. The collector of the transistor 305 is electrically connected to the DC input hot line 301 (which is electrically connected to a DC output of the AC-to-DC converter circuit). The emitter of the transistor 305 is electrically connected to ground 303. An output 306 of the voltage collection unit is electrically connected to the MCU. When the voltage across the transistor 305 is at a zero crossing, the output 306 will provide a signal of a first state to open the relay unit. When the sine wave of the current across the transistor 305 is not at the zero crossing, the output 306 will provide a signal of a second state to close the relay unit. For example, the signal of the first state may be a signal of approximately 1.24 V and the signal of the second state may be a signal of approximately zero V.

Figure 4:
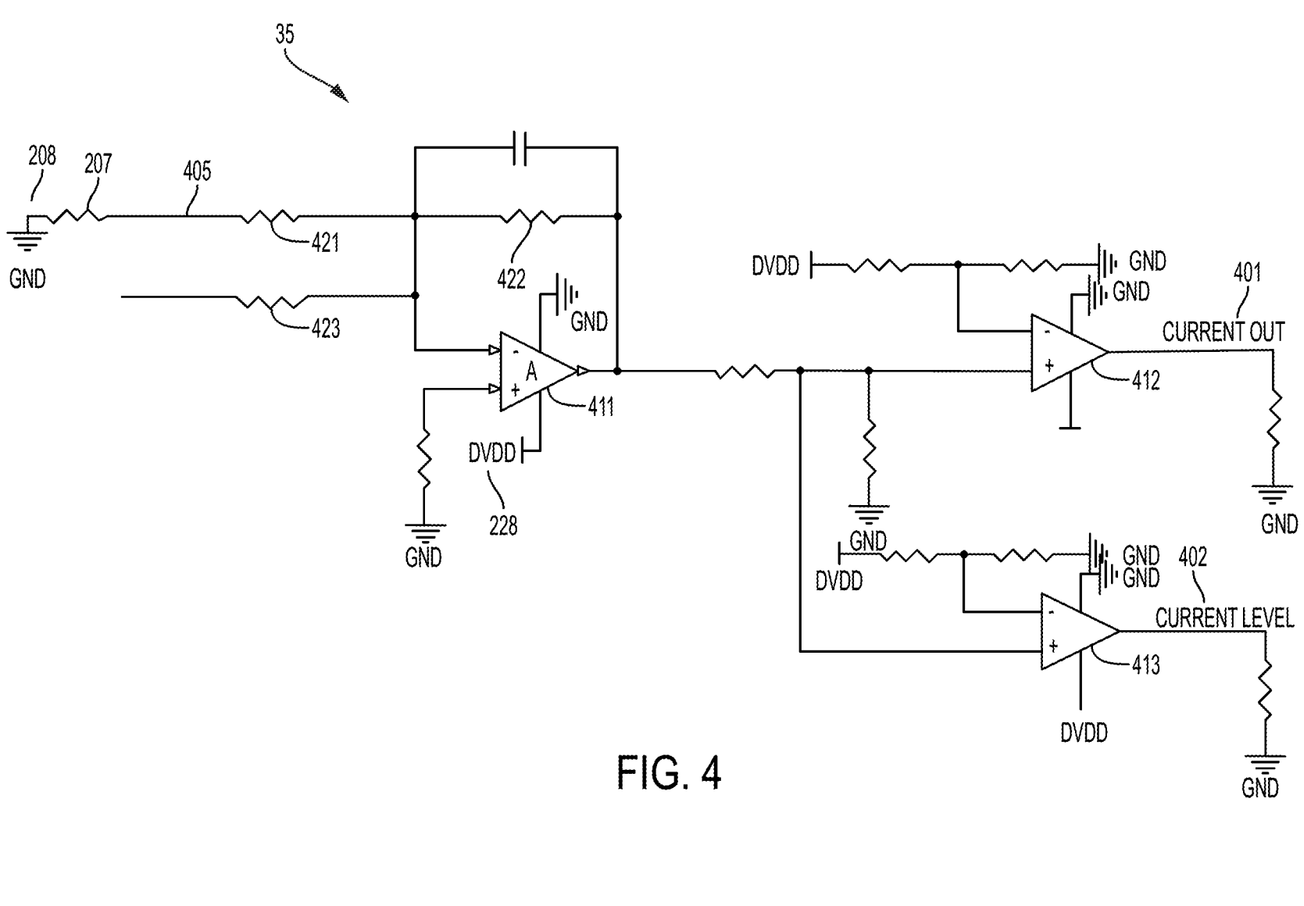
FIG. 4 is a circuit diagram of an example current collection unit.

FIG. 4 is a circuit diagram of an example current collection unit 35. The current collection unit receives the current input signal by being electrically connected across the current sampling resistor 207 of the AC-to-DC converter unit. The current collection unit serves as an addition circuit, as it also includes several comparators that are also electrically connected to the DVDD power line 228 of the AC-to-DC power converter circuit. In the example circuit shown, if one considers the output voltage of the first comparator 411 to be Vo, the voltage on the current input line 405 to be Vi, the resistance across resistor 421 to be R5, the resistance across resistor 422 to be R6 and the resistance across resistor 423 to be R9, then Vo=(Vi/R5+(1.24/R9))*R6. Vo changes with the input voltage Vi. Comparators 412 and 413 are two comparator circuits, which can get two different thresholds, then send the result to the MCU. The current collection unit 35 includes two outputs to the MCU. A first output 401 provides a signal of a first state when a current zero crossing is sensed and a signal of a second state when a current zero crossing is not sensed by the circuit. A second output 402 provides a signal of varying states with an amplitude or other value that corresponds to a level of the input current. The MCU can receive both signals and determine that the relay unit should open its relay at the zero crossing of the current unless the current level is below a threshold value.

Figure 5:
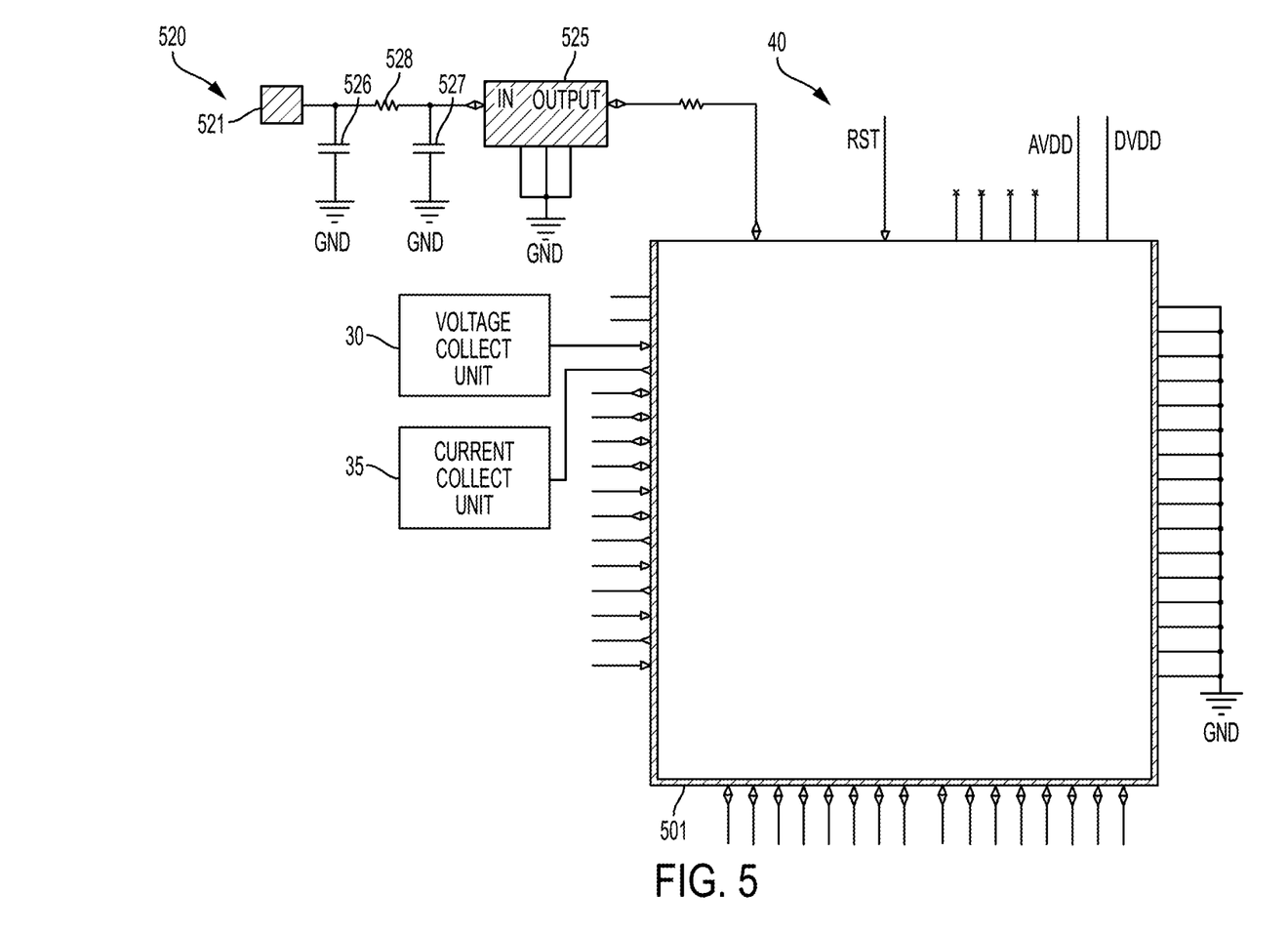
FIG. 5 is a circuit diagram of an example MCU and wireless control unit.

FIG. 5 is a circuit diagram of an example MCU 40. In this embodiment, MCU 40 includes an integrated circuit 501 that functions as a processing device that may receive, interpret and selectively act in response to signals from a button unit 50 (described in more detail below), and/or a wireless LAN via a wireless LAN receiver circuit 520 that includes a receiver that is configured to be communicatively connected to a wireless network. An example integrated circuit may be a Sigma Designs, Inc. ZM510A-CME3R RF transceiver IC, although other integrated circuits may be used. The wireless LAN receiver circuit 520 includes an antenna 521 and a surface acoustic wave (SAW) filter 525 that are configured to receive control signals from the wireless LAN and direct the control signals to the MCU 40. Capacitors 526 and 527 may be connected in parallel across a resistor 528 to reduce signal attenuation. The LAN receiver circuit 520 may be a Z-wave receiver, ZigBee receiver, or a receiver that is configured to operate on a different communication protocol.

The MCU 40 is also electrically connected to the relay unit 60 and is configured to generate and deliver control signals to the relay unit 60 based on signals that the MCU 40 receives from the voltage collect unit 30, current collect unit 35 and/or wireless LAN receiver circuit 520.

Figure 6:
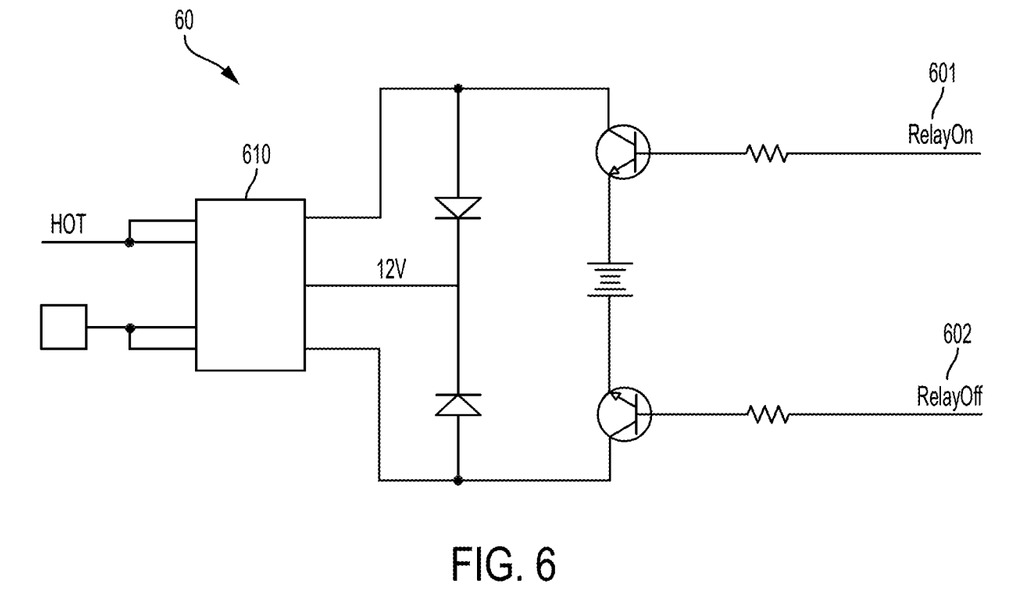
FIG. 6 is an example circuit diagram for a relay unit.

FIG. 6 is an example circuit diagram for a relay unit 60. The relay unit 60 includes a synchronous solid-state relay 610 that selectively delivers power to a connected load. The relay unit 60 include an Relay On signal line 601 and a Relay Off signal line 602 that are electrically connected to their corresponding output pins of the MCU (40 in FIG. 5). The signals received via these signal lines are passed through triodes 604, 605 to a relay 610 that turns the load on or off by selectively sending a voltage across output terminals 621, 622. When the voltage is at a zero crossing the MCU 40 will send a signal to open the relay 610, and when the current is at a zero crossing the MCU 40 will send a signal to close the relay 610 unless the current level is below a threshold. When the relay is closed, the circuit will deliver power to a connected load. When the relay is open, it will stop delivery of and not deliver power to the load. When the current is lower than the threshold, the system may use the voltage zero crossing to close the relay, otherwise it may close the relay at the current zero crossing.

Figure 7:
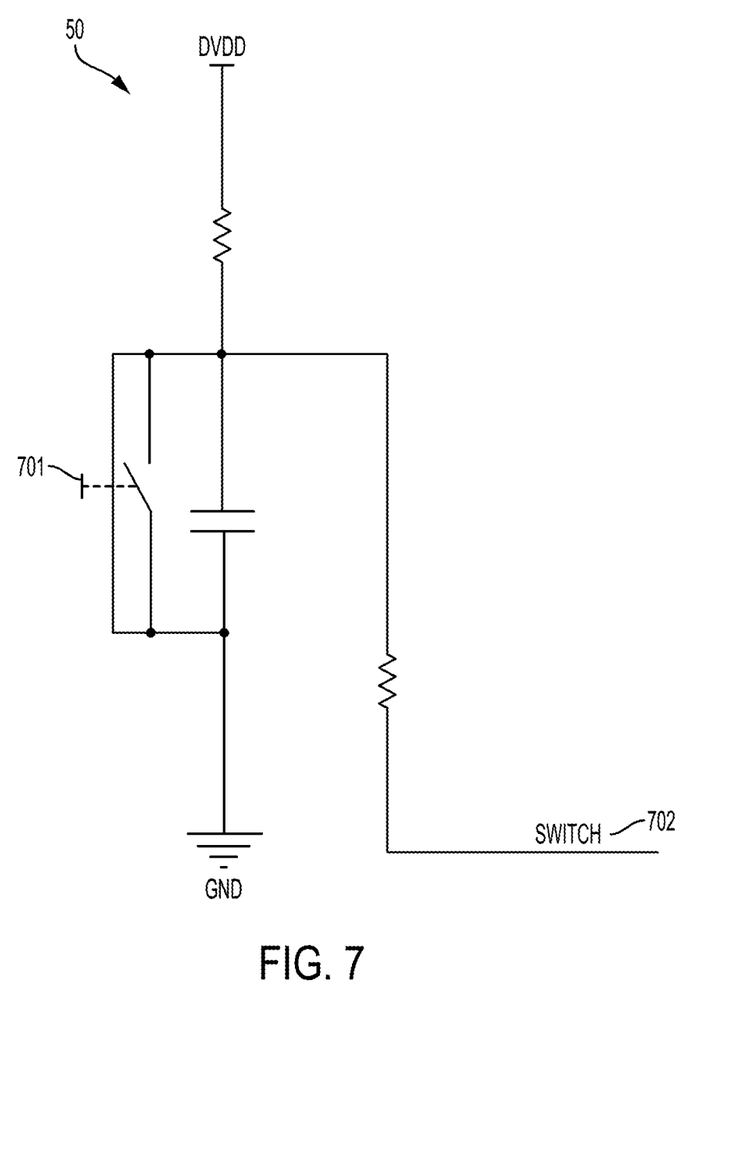
FIG. 7 is a circuit diagram of an example button circuit.

FIG. 7 is a circuit diagram of an example button unit 50. The button unit 50 will include a physical switch 701 that, when actuated to connect an input voltage to ground, will generate an output signal 702 that will be passed to an input of the MCU 40. When the MCU 40 receives the signal, it may actuate or deactuate one or more connected loads in response to a change of state of the signal. For example, the circuit of FIG. 7 shows a normally off switch, and a voltage is passed to the MCU when the switch is actuated. However, a normally on switch may be used in some embodiments, and the change of state from voltage to no voltage may be used by the MCU as an indication that the switch has been actuated. Optionally, multiple switches may be provided, each of which is connected to a different input of the MCU 40 so that the MCU 40 may selectively actuate and/or deactivate two or more loads depending on the input terminal that receive the signal.

Figure 8:
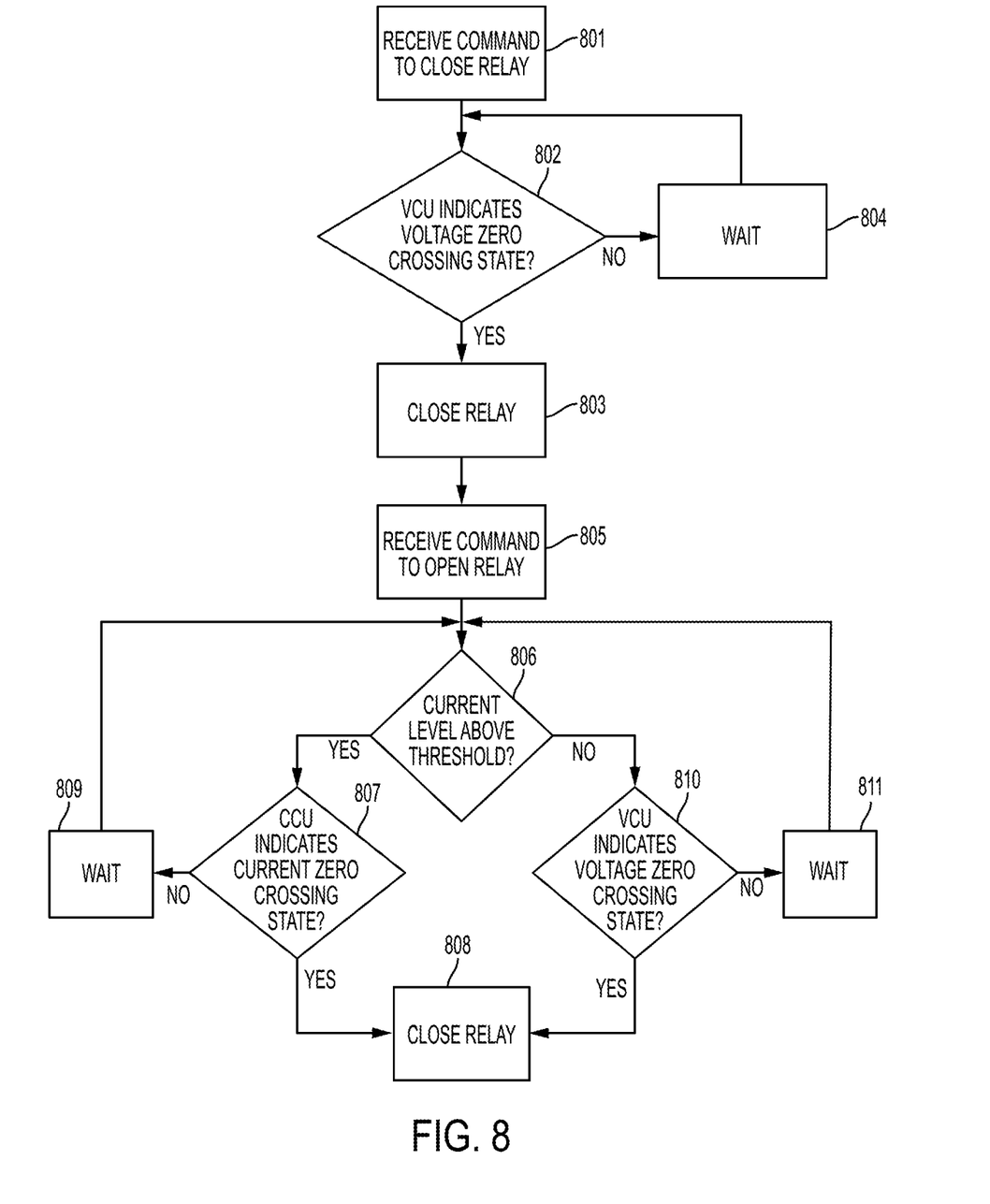
FIG. 8 is an example process flow that an electrical switch device may implement.

FIG. 8 illustrates a process that devices such as those described above may implement. When the relay is open, such that power is not being delivered to the load, an MCU of the device may receive a command to close the relay (step 801). The MCU may receive this command from a button unit, from a remote controller device, or from another control unit via a LAN or other communication network. The MCU will close the relay only if the voltage being provided to the relay is at a zero crossing state. The system does this by analyzing a signal from the VCU to determine whether the signal from the VCU indicates that the relay is at a voltage zero crossing state (step 802). The VCU may be electrically connected to a DC output of an AC-to-DC power converter that is electrically connected to the relay, and to ground. The VCU will generate the signal to indicate that the relay is at a voltage zero crossing state if voltage across the DC output and ground is at a voltage zero crossing state, otherwise the signal may indicate that the relay is not at a voltage zero crossing state.

If the VCU indicates that the relay is at a voltage zero crossing state, the MCU will send a signal to close the relay (step 803). If the VCU indicates that the relay is not at a voltage zero crossing state, the MCU will wait and not close the relay until the voltage is at a zero crossing state (step 804).

When the relay is closed, the MCU of the device may receive a command to open the relay (step 805). The MCU may receive this command from a button unit, from a remote controller device, or from another control unit via a LAN or other communication network. The MCU will open the relay only if (a) the voltage being provided to the relay is at a zero crossing state; or (b) the level of the current is above a threshold and the current collection unit (CCU) indicates that the current is at a zero crossing state. The system does this by analyzing a signal from the CCU to determine whether the signal from the CCU indicates that the system is receiving at least a threshold level of current (step 806). The CCU is electrically connected across an input line of an AC-to-DC power converter that is electrically connected to the relay. The CCU will generate the current level signal as a function of the current level across the input line, using circuitry such as that shown in FIG. 4.

If the CCU indicates that the current level is not above the threshold, then the MCU will generate a signal to open the relay (step 808) when the VCU indicates that the voltage provided to the relay (and thus the relay itself) is at a voltage zero crossing state. If the VCU indicates that the voltage to the relay is not at a zero crossing state (step 810), the MCU will wait and not take any action to change the state of the relay (step 811) until either the VCU indicates that the voltage to the relay is not at a zero crossing state or the CCU indicates that the current level is above the threshold. If the CCU indicates that the current level is above the threshold, then the MCU will generate a signal to open the relay (step 808) when the CCU also indicates that the current provided to the relay (and thus the relay itself) is at a current zero crossing state To determine whether the relay is at a current zero crossing state, the CCU will be electrically connected across an input line of an AC-to-DC power converter that is electrically connected to the relay, The CCU will generate a signal indicating that the relay is at a current zero crossing state if current across the input line is at a current zero crossing state, otherwise the CCU will generate a signal indicating that the relay is not at a current zero crossing state. If the CCU indicates that the current to the relay is not at a zero crossing state (step 807), the MCU will wait and not take any action to change the state of the relay (step 809) until either the CCU indicates that the current to the relay is not at a zero crossing state or the CCU indicates that the current level fell below the threshold.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. A system for controlling delivery of power to a load, comprising:
   a synchronous solid-state relay configured to deliver power to a load when closed and stop delivery of power to the load when open;
   a voltage collection unit that is configured to detect a voltage zero crossing state of voltage provided to the relay; and
   a master control unit (MCU) comprising:
      a processor,
      one or more input terminals that are electrically collected to the voltage collection unit, and
      one or more output terminals that are electrically connected to the relay;
   wherein the MCU is configured to command the relay to close in response to received commands by, upon receipt of a command to close the relay, analyzing a signal from the voltage collection unit and closing the relay when the signal from the voltage collection unit indicates that the relay is at the voltage zero crossing state.

2. The system of claim 1:
   further comprising a current collection unit that is electrically connected to one or more input terminals of the MCU, and that is configured to detect a current zero crossing state of current provided to the system; and
   wherein the MCU is configured to command the relay to open in response to received commands by, upon receipt of a command to open the relay:
      analyzing a current level signal from the current collection unit,
      if the current level signal is above a threshold level, causing the relay to open when current provided to the system is at the current zero crossing state, and
      if the current level signal is not above the threshold level, causing the relay to open when the voltage provided to the relay is at the voltage zero crossing state.

3. The device of claim 1, further comprising an AC-to-DC power converter that is:
   electrically connected to the MCU; and configured to convert power received from an AC source into DC power and provide the DC power to the MCU and to the relay.

4. The system of claim 3, wherein the AC-to-DC power converter comprises:
a half-wave bridge that is configured to receive AC power from the AC source and convert the AC power into DC power of a first voltage; and
a DC-to-DC converter that is configured to step down the DC power from a first voltage to a second voltage that is lower than the first voltage and that corresponds to a voltage requirement of the load.

5. The system of claim 3, wherein the AC-to-DC power converter further comprises a resistor-capacitor voltage drop circuit that includes a zener diode, the DC-to-DC converter, and a voltage drop capacitor that are electrically connected to each other in parallel.

6. The system of claim 1, wherein the voltage collection unit is configured to detect the zero crossing state of voltage provided to the relay by being electrically connected to a DC output of an AC-to-DC power converter that is electrically connected to the relay, and thus being configured to detect the zero crossing state of voltage at the DC output.

7. The system of claim 6, wherein the voltage collection unit comprises a transistor having a base that is connected to a neutral line of the AC-to-DC power converter and an emitted that is electrically connected to ground.

8. The system of claim 2, wherein the current collection unit comprises a set of comparators that are configured to provide a signal of a first state when the current collection unit senses a current zero crossing and a signal of a second state when the current collection unit does not sense a current zero crossing.

9. The system of claim 2, wherein the current collection unit is configured to detect the zero crossing state of current provided to the relay by being electrically connected to an input line of an AC-to-DC power converter that is electrically connected to the relay, and thus being configured to detect the zero crossing state of current across the input line.

10. The system of claim 1, further comprising a button unit that includes a switch and that is configured to change a state of a signal to the MCU when the switch is actuated.

11. The system of claim 1, further comprising a wireless local area network receiver that is electrically connected to or part of the MCU, for receiving the commands.

12. A method of controlling delivery of power to a load, comprising:
by a master control unit (MCU) of a system comprising the MCU and a voltage collection unit (VCU):
receiving a command to open a synchronous solid-state relay,
analyzing a signal from the VCU to determine whether the signal from the VCU indicates that the relay is at a voltage zero crossing state,
opening the relay if the signal from the VCU indicates that the relay is at a voltage zero crossing state, otherwise not opening the relay until the signal from the VCU indicates that the relay is at a voltage zero crossing state.

13. The method of claim 12, wherein:
the system also comprises a current collection unit (CCU); and
the method further comprises, by the MCU:
receiving a command to open the relay,
analyzing a current level signal from the CCU,
if the current level signal is above a threshold, closing the relay when the CCU indicates that the system is at a current zero crossing state, and
if the current level is not above the threshold, closing the relay when the signal from the VCU indicates that the relay is at the voltage zero crossing state.

14. The method of claim 12, wherein:
the VCU is electrically connected to a DC output of an AC-to-DC power converter that is electrically connected to the relay; and
the method further comprises, by the VCU, generating the signal from the VCU to indicate that the relay is at a voltage zero crossing state if voltage at the DC output is at a voltage zero crossing state, otherwise generating the signal from the VCU to indicate that the relay is not at a voltage zero crossing state.

15. The method of claim 12, wherein:
the CCU is electrically connected across an input line of an AC-to-DC power converter that is electrically connected to the relay; and
the method further comprises, by the CCU, indicating that the system is at a current zero crossing state if current across the input line is at a current zero crossing state, otherwise indicating that the relay is not at a current zero crossing state.

16. The method of claim 15 further comprising, by the CCU, generating the current level signal as a function of a level of current delivered to the input line of the AC-to-DC power converter.

17. A method of controlling delivery of power to a load, comprising:
by a master control unit (MCU) of a system comprising the MCU, a voltage collection unit (VCU) and a current collection unit (CCU):
receiving a command to open a synchronous solid-state relay,
analyzing a current level signal from the CCU,
if the current level signal is above a threshold, closing the relay when the CCU indicates that the relay is at a current zero crossing state, and
if the current level is not above the threshold, closing the relay when the signal from the VCU indicates that the relay is at the voltage zero crossing state.

18. The method of claim 17, wherein:
the CCU is electrically connected across an input line of an AC-to-DC power converter that is electrically connected to the relay; and
the method further comprises, by the CCU, indicating that the relay is at a current zero crossing state if current across the input line is at a current zero crossing state, otherwise indicating that the relay is not at a current zero crossing state.

19. The method of claim 17, wherein:
the VCU is electrically connected to a DC output of an AC-to-DC power converter that is electrically connected to the relay; and
the method further comprises, by the VCU, generating the signal from the VCU to indicate that the relay is at a voltage zero crossing state if voltage at the DC output is at a voltage zero crossing state, otherwise generating the signal from the VCU to indicate that the relay is not at a voltage zero crossing state.

20. The method of claim 17 further comprising, by the CCU, generating the current level signal as a function of a level of current delivered to the input line of the AC-to-DC power converter.

* * * * *